United States Patent [19]
Nakagawa et al.

[11] Patent Number: 6,127,951
[45] Date of Patent: Oct. 3, 2000

[54] MODULATING DEVICE, MODULATING DEVICE, DEMODULATING DEVICE, DEMODULATING DEVICE, AND TRANSMISSION MEDIUM RUN LENGTH LIMITED CODER/DECODER WITH RESTRICTED REPETITION OF MINIMUM RUN OF BIT SEQUENCE

[75] Inventors: Toshiyuki Nakagawa; Yoshihide Shinpuku, both of Kanagawa, Japan

[73] Assignee: Sony Corporation, Tokyo, Japan

[21] Appl. No.: 09/150,397

[22] Filed: Sep. 9, 1998

[30] Foreign Application Priority Data

Sep. 11, 1997 [JP] Japan ..................... 9-246325

[51] Int. Cl.⁷ .............................. H03M 7/46; H03M 7/00
[52] U.S. Cl. ................................. 341/59; 341/58
[58] Field of Search ................... 341/59, 58, 67, 341/81, 82, 106

[56] References Cited

U.S. PATENT DOCUMENTS

| | | | |
|---|---|---|---|
| 5,400,023 | 3/1995 | Ino et al. ............................ | 341/59 |
| 5,528,236 | 6/1996 | Shimpuku et al. ................... | 341/58 |
| 5,600,315 | 2/1997 | Shimpuku et al. ................... | 341/59 |

FOREIGN PATENT DOCUMENTS

| | | |
|---|---|---|
| 0 744 838 | 11/1996 | European Pat. Off. . |
| 0 880 234 | 11/1998 | European Pat. Off. . |
| 0 903 864 | 3/1999 | European Pat. Off. . |
| 0 923 077 | 6/1999 | European Pat. Off. . |
| WO 94 18670 | 8/1994 | WIPO . |

*Primary Examiner*—Brian Young
*Assistant Examiner*—John B. Nguyen
*Attorney, Agent, or Firm*—Frommer Lawrence & Haug, LLP.; William S. Frommer

[57] ABSTRACT

In a modulation processing unit, m bits of input data are converted to an n bit fixed length code. In an RML conversion unit, a restriction code which limits a minimum run d in a channel bit sequence after converting the fixed length code from repeatedly occurring a predetermined number of times, is converted to a data sequence. A clock is stably reproduced.

22 Claims, 8 Drawing Sheets

MODULATING DEVICE, MODULATING DEVICE, DEMODULATING DEVICE, DEMODULATING DEVICE, AND TRANSMISSION MEDIUM RUN LENGTH LIMITED CODER/DECODER WITH RESTRICTED REPETITION OF MINIMUM RUN OF BIT SEQUENCE

BACKGROUND OF THE INVENTION

1. Field of the Invention

This invention relates to a modulating device, demodulating device and transmission medium, and in particular to a modulating device, demodulating device and transmission medium which are suitable for modulating data for data transmission or recording on a recording medium, and demodulating the modulation code obtained by this modulation so as to reproduce the data.

2. Description of the Related Art

When data is transmitted on a predetermined transmission path or recorded for example on recording media such as magnetic disks, optical disks, and magneto-optical disks, data modulation is performed which is suitable for transmission or recording.

One such type of modulation is known as block coding This block coding converts a data sequence to blocks of m×i bit units (referred to hereafter as data words), and this data word is converted to a code word comprising n×i bits according to a suitable code rule When i=1, this code is a fixed length code expressed by (d,k;m,n;1). When plural i are selected, a predetermined i is selected from the range 1 to imax (maximum value of i) and the conversion is performed, the code is a variable-length code. This block encoded code is represented by a variable length code (d,k;m,n;r).

Here, i is known as a restriction length, and imax is r (the maximum restriction length). The minimum run d shows the minimum number of consecutive "0"s in repeated "1"s in a code sequence. The maximum run k shows the maximum number of consecutive "0"s in repeated "1"s in a code sequence.

In compact disks or mini-discs (trademark) etc., NRZI (Non Return to Zero Inverted) modulation, wherein "1" means inversion and "0" means non-inversion, is performed on the variable length code obtained as above, and the NRZI modulated variable length code (hereafter, referred to as a recorded waveform sequence) is recorded.

Various modulation techniques have been proposed. If the minimum inversion interval of the recorded waveform sequence is Tmin(=d+1), and the maximum inversion interval is Tmax(=k+1), to record at a high density in a linear velocity direction, the minimum inversion interval Tmin should be long, that is, the minimum run d should be large. From the clock reproduction aspect, moreover, the maximum inversion interval Tmax should be short, that is, the maximum run k should be small.

One modulation technique used by magnetic disks or magneto-optical disks, etc., is RLL(1–7). The parameters of this modulating technique are (1,7;2,3;2). The minimum inversion interval Tmin is 2(=1+1) T (=($\frac{2}{3}$)×2Tdata= 1.33Tdata). The maximum inversion interval Tmax is 8(=7+ 1) T(=($\frac{2}{3}$)×8Tdata=5.33Tdata). In addition, a detection window width Tw(=(m/n)XT) is 0.67(=$\frac{2}{3}$) Tdata.

For example, the variable length conversion table for the RLL(1–7) code is as follows:

TABLE 1

RLL (1,7;2,3;2)

| | data | code |
|---|---|---|
| i=1 | 11 | 00x |
| | 10 | 010 |
| | 01 | 10x |
| i=2 | 0011 | 000 00x |
| | 0010 | 000 010 |
| | 0001 | 100 00x |
| | 0000 | 100 010 |

The symbol x in the conversion table is 1 when the next channel bit is 0, and 0 when the next channel bit is 1. The restriction length r is 2.

However, the RLL(1–7) code can be formed from fixed length codes. It may be expected that modulation/demodulation will be easier if fixed length codes are used. For example, as the output is always a fixed number of bits, i.e. data words are output two bits at a time, and code words are output three bits at a time, the construction is simple.

The fixed length conversion table for the RLL(1–7) code is as follows. Herein, to distinguish it from the aforesaid variable-length, the fixed length table will be represented by RLL-F(1–7).

The parameters of RLL-F(1–7) are (1,7;2,3;1), and if the recorded waveform sequence bit interval is T, the minimum inversion interval Tmin is 2 (=1+1) T. If the data sequence bit interval is Tdata, the minimum inversion interval Tmin is 1.33(=($\frac{2}{3}$)×2) Tdata. Moreover, the maximum inversion interval Tmax is 8T (5.33Tdata). Further, the detection window width Tw is given by (m/n) xT, and its value is 0.67(=$\frac{2}{3}$) T. The RLL-F(1–7) table is shown in Table 2. This table is an ISO standard table.

TABLE 2

RLL-F (1,7;2,3;1)

| Immediately preceding code word | Current data word | Next data word | Converted code word |
|---|---|---|---|
| x | 00 | 0x | 001 |
| 0 | 00 | 1x | 000 |
| 1 | 00 | 1x | 010 |
| 0 | 01 | 0x | 001 |
| 0 | 01 | 1x | 000 |
| 1 | 01 | 00 | 010 |
| 1 | 01 | not 00 | 000 |
| 0 | 10 | 0x | 101 |
| 0 | 10 | 1x | 010 |
| 0 | 11 | 00 | 010 |
| 0 | 11 | not 00 | 100 |

"x" in the above conversion table shows that either 0 or 1 is acceptable. not00 means any of the data words 01, 10 and 11.

This RLL-F(1–7) (1,7;2,3;l) may also be obtained by replacing converted data words as in Table 3. Further, demodulation can be performed 1:1 as in the above Table 2.

TABLE 3

RLL-F (1,7;2,3;1) (2)

| Immediately preceding code word | Current data word | Next data word | Converted code word |
|---|---|---|---|
| 0 | 00 | 11 | 010 |
| 0 | 00 | not 11 | 100 |
| 0 | 01 | 0x | 010 |
| 0 | 01 | 1x | 101 |
| 0 | 10 | 0x | 000 |
| 0 | 10 | 1x | 001 |
| 1 | 10 | 11 | 010 |
| 1 | 10 | not 11 | 000 |
| 0 | 11 | 0x | 000 |
| 1 | 11 | 0x | 010 |
| x | 11 | 1x | 001 |

'x' in the aforesaid conversion table shows that either 0 or 1 is acceptable. Moreover, not11 means any of the data words 00, 01 and 10. However, considering a T distribution of a channel bit sequence which is modulated by the aforesaid (1–7) codes, the occurrence frequency of 2T which is Tmin is the greatest, 3T, 4T, and 5T are less, and the occurrence frequency of 8T is the least. In general, if a large amount of edge information occurs early as in the case of 2T and 3T, this is advantageous for clock reproduction. However, when on the other hand 2T occurs repeatedly, the output waveform amplitude is smaller than for large T such as for example 5T and 6T. This is because the output during playback is smaller the higher the region depending on the optical characteristics of the lens.

In the RLL(1–7) code, 2T is output the most toward the high region. When a minimum mark is repeatedly recorded at a high linear density, its reproduction output is small, so patterns with poor S/N increase, and this makes signal detection unstable.

Further, for example, when high region playback characteristics deteriorate due to, for example, defocusing or inclination in a tangential direction, clock reproduction is expected to become more unstable.

RLL(1–7) is often combined with PRML (Partial Response Maximum Likelihood), to improve S/N during playback of a high density recording. This method comprises, for example, Viterbi decoding equalized by PR (1,1) or PR(1,2,1) by matching the RF reproduction waveform to media characteristics. For example, a desirable reproduction output when equalization is performed by PR(1,1) is as follows.

```
1 0 1 0 0 1 0 (channel bit data swquence)
1 1 0 0 1 0 0 (after NRZI conversion)
......
1 1
  1 1
   -1 -1
     -1 -1
       1 1
         1 1
          -1 -1
         ......
...+2 0 -2 0 +2 0 ... (reproduction output).
```

Therefore, when 2T which is Tmin occurs repeatedly, waveform equalization is performed to approach this reproduction output. In general, the waveform interference becomes longer the higher the linear density, therefore, waveform equalization also becomes longer as in PR(1,2,2,1) or PR(1,1,1,1).

However when the minimum run d=1 and a suitable waveform equalization is PR (1,1,1,1) as a result of high linear density, considering a situation when 2T which is Tmin occurs repeatedly, the playback signal at that time is

```
1 0 1 0 1 0 1 0 1 0 (channel bit data sequence)
1 1 0 0 1 1 0 0 1 1 (after NRZI conversion)
......
1 1 1 1
  1 1 1 1
    -1 -1 -1 -1
      -1 -1 -1 -1
        1 1 1 1
          1 1 1 1
            -1 -1 -1 -1
           ......
...0 0 0 0 ... (reproduction output)
``` and the zero level will be traced for a long time.

This shows that a situation when practically no signal level is output after waveform equalization continues, and causes considerable loss of data reproduction or clock reproduction stability. In addition, merge does not occur while 2T continues even when Viterbi decoding is performed.

This kind of channel bit data sequence where Tmin is repeated, for example in the case of RLL (1,7;2,3;2) in Table 1, occurs when the premodulated data sequence is "10-01-10-01-10- . . . "

Similarly, in the case of RLL-F(1,7;2,3;1) in Table 2, this occurs when the premodulated data sequence is "10-00-10-00-10- . . ."

In the case of RLL-F(1,7;2,3;1) (2) in Table 3, this occurs when the premodulated data sequence is "01-11-01-11-01- . . . "

As described hereabove, when recording media such as magnetic disks, magneto-optic disks or optical disks are high density, and when a code such as RLL(1–7) or RLL-F(1–7) is selected as a modulation code, if the minimum inversion interval Tmin occurs too many times in succession, patterns with poor S/N occur repeatedly, so signal detection is unstable which is disadvantageous for clock reproduction.

Similarly, in the case of high linear density, if the minimum inversion interval Tmin occurs repeatedly when PR(1,1,1,1) equalization is performed for the d=1 code, the reproduced signal will be zero for a long time and Viterbi decoding will not merge, which is disadvantageous for clock reproduction.

SUMMARY OF THE INVENTION

This invention, which was conceived in view of this situation, aims to permit more stable clock reproduction than in the case of, for example, conventional RLL-F(1–7), which is a fixed length block code, by adding a code which limits the number of times the minimum inversion interval Tmin occurs repeatedly, to a similar modulation table.

The modulating device according to claim 1 comprises dividing means which divides a data sequence into m bit code words, and conversion means which converts an m bit data sequence having a minimum run d of 1 or more into an n bit fixed length code, and when the minimum run d in a channel bit sequence after fixed length code conversion is repeated a predetermined number of times, converts the data sequence into a restriction code which limits this repeated number of times.

The modulating method according to claim 15, when the minimum run d in a channel bit sequence after conversion to a fixed length code having a minimum run d of 1 or more is repeated a predetermined number of times, assigns a restriction code which limits this repeated number of times.

The transmitting medium according to claim 16 transmits a program which, when the minimum run d in a channel bit sequence after conversion to a fixed length code having a minimum run d of 1 or more is repeated a predetermined number of times, assigns a restriction code which limits this repeated number of times.

The demodulating device according to claim 17 comprises a dividing means which divides a code word sequence into n bit data sequences, and further comprises a conversion means which converts an n bit fixed length code having a minimum run d of 1 or more into an m bit data sequence, and when the minimum run d in a channel bit sequence of the fixed length code is repeated a predetermined number of times, converts a restriction code which limits this repeated number of times into a predetermined data sequence.

The demodulating method according to claim 21 converts an n bit fixed length code having a minimum run d of 1 or more into an m bit data sequence, and converts a restriction code which limits the number of times the minimum run d occurs in a channel bit sequence of the fixed length code, to a predetermined data sequence.

The transmitting medium according to claim 22 transmits a program which, when an n bit fixed length code having a minimum run d of 1 or more is converted into an m bit data sequence, converts a restriction code which limits the number of times the minimum run d occurs in a channel bit sequence of the fixed length code, into a predetermined data sequence.

In the modulating device according to claim 1, a dividing means divides a data sequence into m bit code words, and a conversion means which converts an m bit data sequence having a minimum run d of 1 or more into an n bit fixed length code, and when the minimum run d in a channel bit sequence after fixed length code conversion is repeated a predetermined number of times, converts the data sequence into a restriction code which limits this repeated number of times.

In the modulating method according to claim 15, the minimum run d in a channel bit sequence after conversion to a fixed length code having a minimum run d of 1 or more is repeated for a predetermined number of times, a restriction code is assigned which limits this repeated number of times.

In the transmitting medium according to claim 16, when the minimum run d in a channel bit sequence after conversion to a fixed length code having a minimum run d of 1 or more is repeated a predetermined number of times, a restriction code is assigned which limits this repeated number of times In the demodulating device according to claim 17, the dividing means divides a code word sequence into n bit data sequences, and the conversion means converts an n bit fixed length code having a minimum run d of 1 or more into an m bit data sequence, and converts a restriction code, which limits the minimum run d in a channel bit sequence of the fixed length code from occurring repeatedly a predetermined number of times, into a predetermined data sequence.

In the demodulating method according to claim 21, an n bit fixed length code having a minimum run d of 1 or more is converted into an m bit data sequence, and a restriction code which limits the number of times the minimum run d occurs in a channel bit sequence of the fixed length code, is converted to a predetermined data sequence.

In the transmitting medium according to claim 22, an n bit fixed length code having a minimum run d of 1 or more is converted into an m bit data sequence, and a restriction code which limits the number of times the minimum run d occurs in a channel bit sequence of the fixed length code, is converted into a predetermined data sequence.

DETAILED DESCRIPTION OF THE PREFERRED EMBODIMENTS

Figure 1:
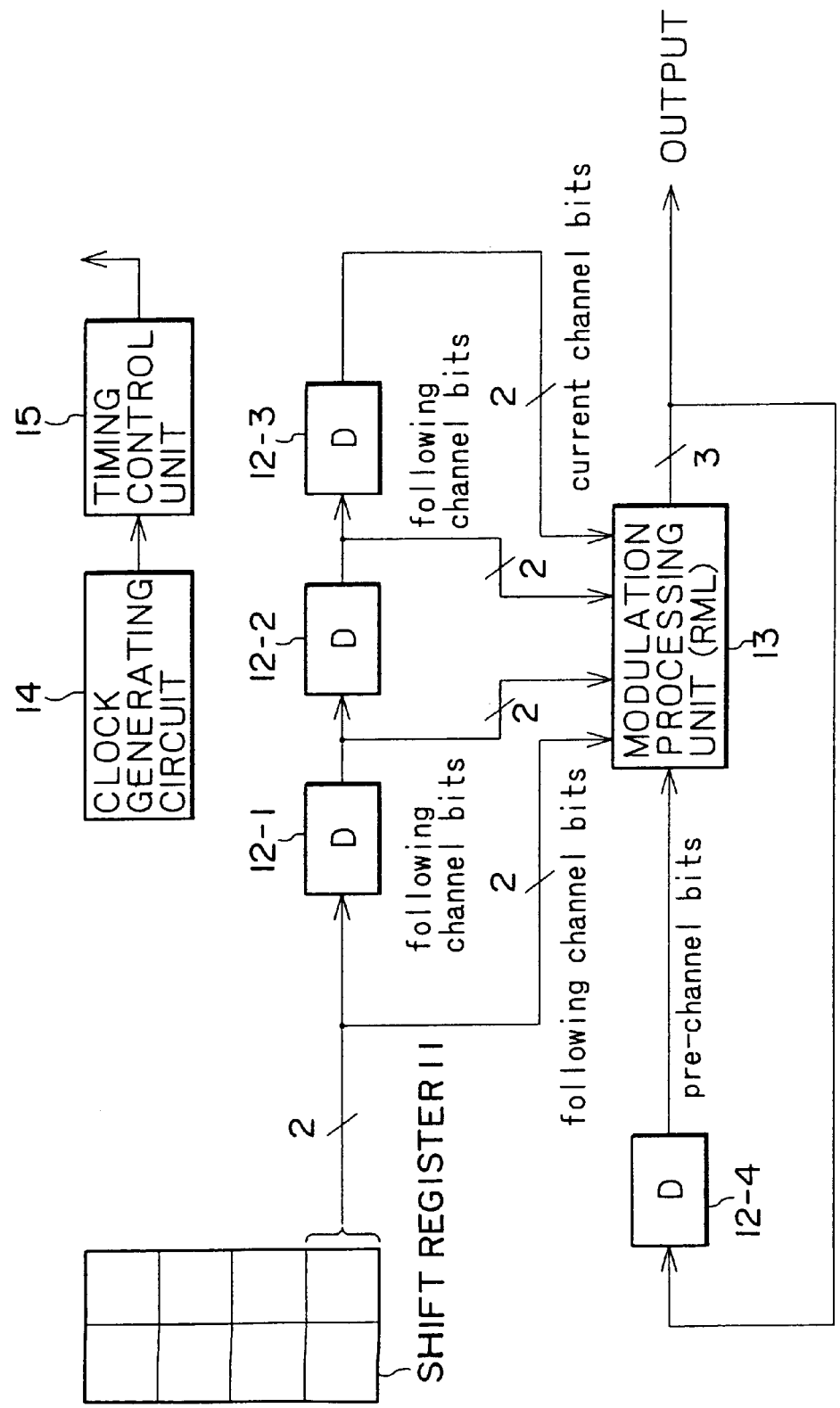
FIG. 1 is a block diagram showing a typical construction of one embodiment of a modulating device according to this invention.

Hereafter, the modulating device according to this invention will be described referring to the drawings. According to this embodiment, one type of device is provided which converts data having a basic data length of m bits to a fixed length code (d,k;m,n;1). FIG. 1 shows the detailed circuit construction.

According to this embodiment, data having a basic data length of two bits is converted to a fixed length code (1,7;2,3;1) by a conversion table comprising a code which limits a minimum run d in a channel bit sequence of an RLL(1–7) code from occurring a predetermined number of times.

A shift register 11 divides the input data into two bit lengths, and this is output to a modulation processing unit 13 and delay element 12-1. The two bits of data output by the delay element 12-1 is further delayed by a delay element 12-2 and delay element 12-3, and supplied to the modulation processing unit 13. The outputs from the delay element 12-1 and delay element 12-2 are both supplied to the modulation processing unit 13. As a result, a total of eight bits of data, i.e. the current two bits and the immediately preceding six bits, is supplied to the modulation processing unit 13.

The output from the modulation processing unit 13 is resupplied, via a delay element 12-4, to the modulation processing unit 13.

A clock generation circuit 14 generates a predetermined channel clock and outputs it to a timing control unit 15. The timing control unit 15 generates a timing signal which is synchronized with the input channel clock, and outputs it to each unit.

When the fixed lengthcode (d,k;m,n;1) is, for example, a fixed length code 1,7;2,3;1), i.e. when d which is the minimum run of "0" is 1 bit, k which is the maximum run of "0" is 7 bits, m which is the basic data length is 2 bits, n which is the basic code length is 3 bits, and r which is the maximum restriction length is 1, the conversion table is such as is shown for example in the following Table 4. As is seen from this Table 4, the code which limits repetition of the minimum run d is given independently, and if this part is included, the maximum restriction length may be represented by 3. In the following Table 4, the code which limits repetition of the minimum run is added to the fixed length RLL(1–7).

TABLE 4

RML-F (1,7;2,3;1<3>)

| Immediately preceding code word | Current data word | Next data word | Converted code word |
|---|---|---|---|
| 0 | 00 | 11 | 010 |
| 0 | 00 | not 11 | 100 |
| 0 | 01 | 0x | 010 |
| 0 | 01 | 1x | 101 |
| 0 | 10 | 0x | 000 |
| 0 | 10 | 1x | 001 |
| 1 | 10 | 11 | 010 |
| 1 | 10 | not 11 | 000 |
| 0 | 11 | 0x | 000 |
| 1 | 11 | 0x | 010 |
| x | 11 | 1x | 001 |
| x | 01 | 11-01-1x | 100-000-001 |

"x" in the above conversion table shows that either 0 or 1 is acceptable. not11 means any of the data words 00, 01 and 10.

For purposes of distinction, a table to which a code which limits the minimum run length is added such as Table 4 is referred to as RML (Repeated Minimum Run Length Limited).

However, the converted code word must maintain the minimum run d. Further, as described hereafter, the maximum run k should also be maintained, although it may not be depending on the case.

In Table 4, the data word sequence which limits the repetition of the minimum run d was chosen as "01-11-01-1x". This is the pattern and minimum necessary data word sequence for which Table 4 operates correctly.

For example, if it is additionally attempted to make a conversion to the above 9 bit code word (100-000-001) even when the "next data word" in Table 4 is "01-11-0x" or "01-11-01", patterns appear in the code words generated by Table 4 which do not maintain the minimum run 2T (=d), hence this conversion cannot be used.

Likewise, if it is attempted to make a conversion to the above 9 bit code word even when the immediately preceding code word in Table 4 is "1" and the following data word is "11-01-0x", patterns appear in the code words generated by Table 4 which do not maintain the minimum run 2T (=d), hence this conversion cannot be used either.

The data output by the shift register 11 is input to the modulation processing unit 13 while being shifted two bits at a time by the delay elements 12-1 to 12-3. Data is also supplied from the input stages of the delay elements 12-1 to 12-3 to the modulation processing unit 13. As a result, the following three blocks of data are input to the modulation processing unit 13 in addition to the current block of data (a total of 8 consecutive bits).

The modulation processing unit 13 comprises the table shown in Table 4, and converts the input data to code words according to its conversion rule. That is, it converts it to code words referring to the current data word, the following data word, and the immediately preceding code word re-input from the output signal via the delay element 12-4.

Herein, in the RML conversion unit of the modulation processing unit 13, if when the current data word is "01" and 5 data bits are looked up, "01" is followed by "11-01-1x", the code word "100-000-001" is output. As a code corresponding to three blocks of data (6 (=2×3) bits of input data) was determined on one occasion, timing control is performed so that 3 bits at a time is output from the output unit of the modulation processing unit 13.

When conversion other than RML conversion is performed, the processing proceeds one block at a time, which is two data word units, and this is output. For example, when the immediately preceding code word bit is "0", the current data word is "00" and the following data word is "11", the current data word conversion is determined to be "010" and "010" is output. Also, the final "0" is re-input to the modulation processing unit 13 via the delay element 12-4 for subsequent processing.

The immediately preceding code words input to the modulation processing unit 13 may be the three code words that were output, or the last code word of nine code words maybe input. For example, when RML conversion is performed the output is "100-000-001", but it is re-input to the modulation processing unit 13 via the delay element 12-4 and the last "1" is used for subsequent conversion processing.

Figure 2:
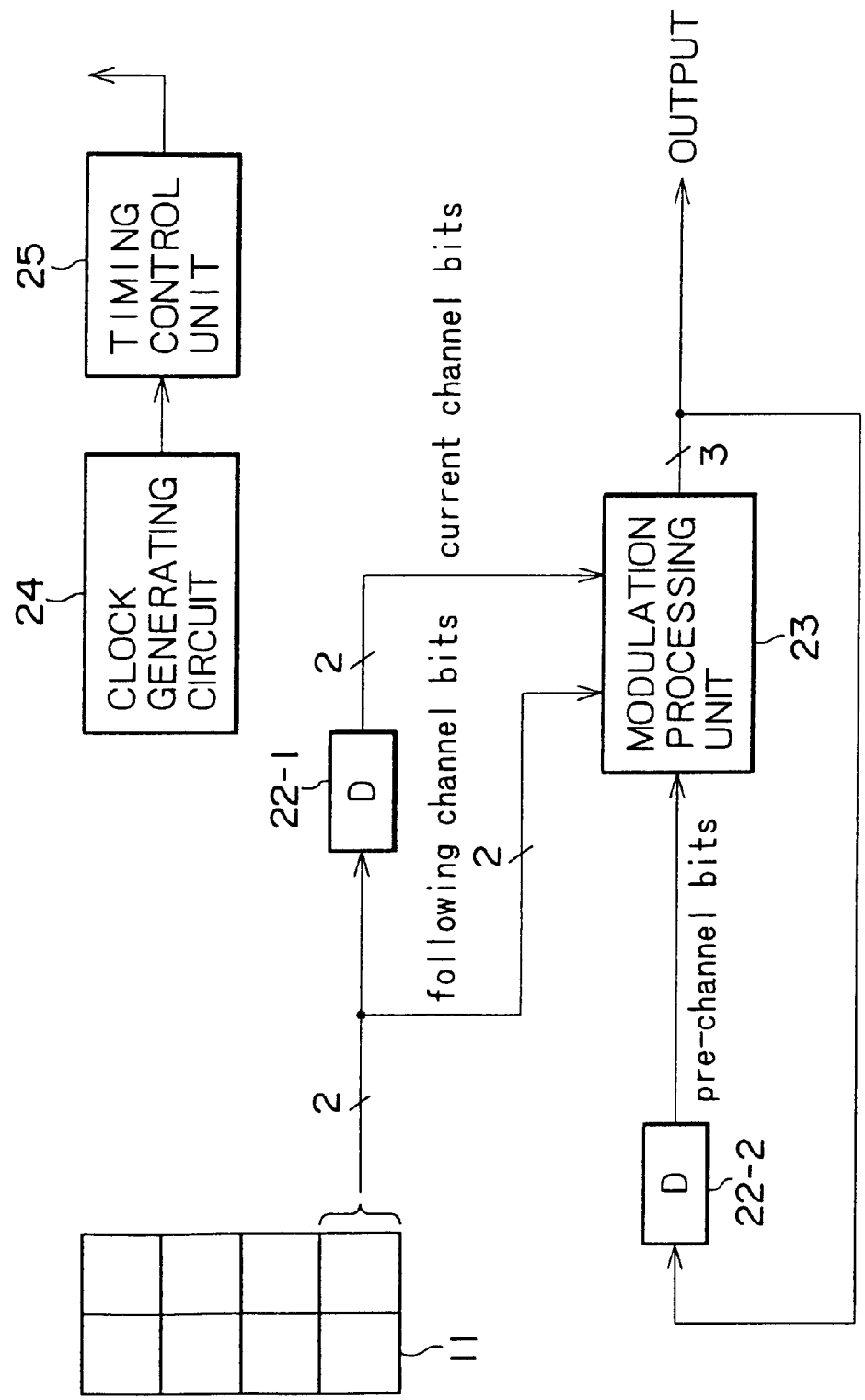
FIG. 2 is a block diagram showing a typical construction of a modulating device according to the prior art for comparison with the embodiment of FIG. 1.

For comparison, the construction of the modulating unit when data is modulated using Table 2, which is a conventional fixed length RLL(1–7) code, is shown in FIG. 2. In the example shown in FIG. 2, data output by the shift register 11 is supplied two bits at a time to a modulation processing unit 23 and a delay element 22-1. After the delay element 22-1 has delayed the input two bits of data, it is output to the modulation processing unit 23. Of the data output by the modulation processing unit 23, the last bit is re-input to the modulation processing unit 23 via a delay processing unit 22-2.

In the example of FIG. 2, it is sufficient to look up two bits for the following data word, so the delay element may comprise only one stage. The modulation processing unit 23 converts data into code words according to the conversion rules shown in Table 2. The code words thus determined are always three bits, and these are timing controlled so that they are output every other three bits.

The modulating unit which performs modulation based on the fixed length RLL(1–7) code of Table 3 has an identical construction to that shown in FIG. 2.

Figure 3:
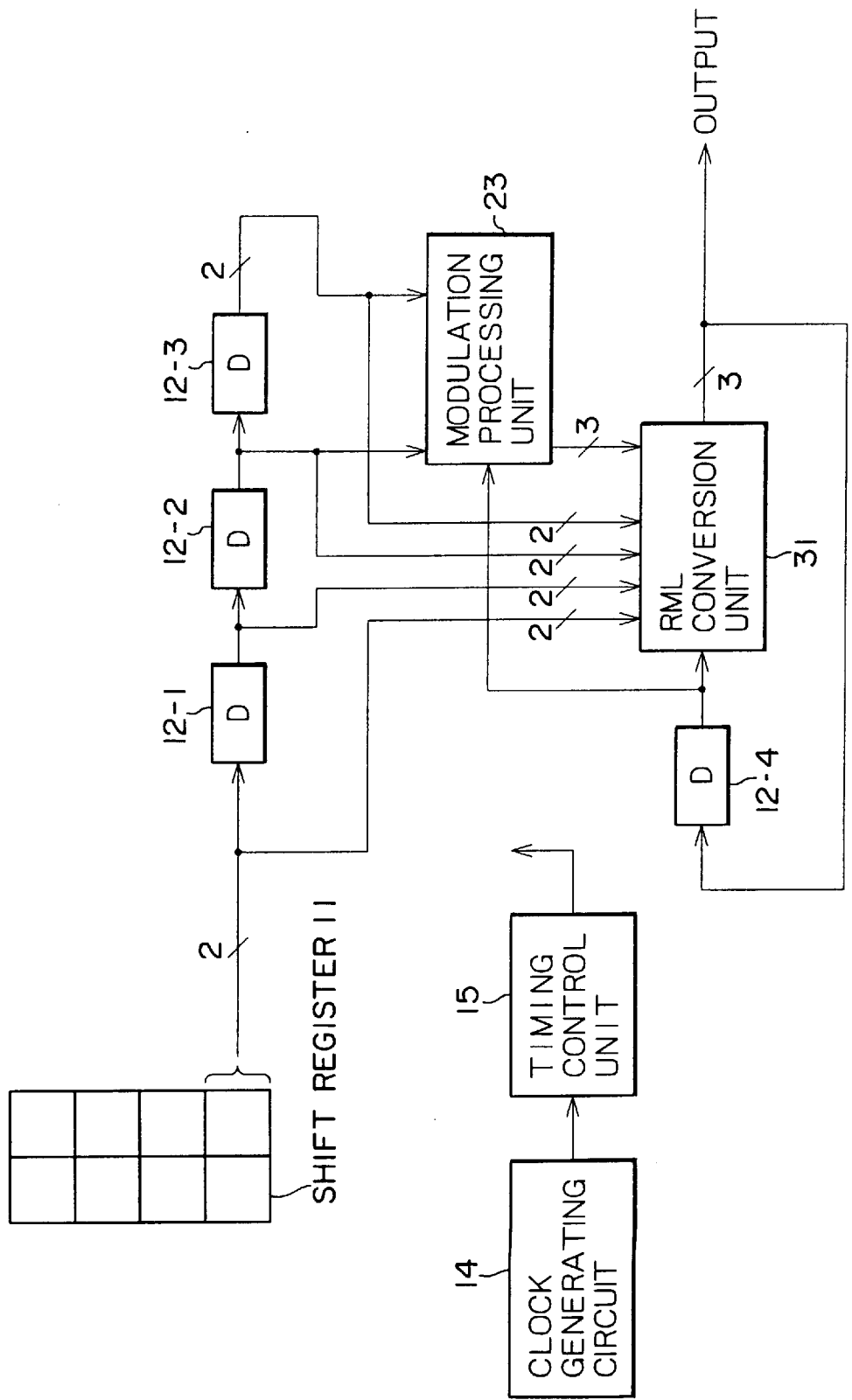
FIG. 3 is a block diagram showing a modification of the embodiment of FIG. 1.

FIG. 3 is another example of a different modulating unit which performs modulation according to Table 4, which is a fixed length RML(1–7) code. The modulation processing unit 13 of FIG. 1 is here split into the modulation processing unit 23 identical to that of FIG. 2 which performs conventional RLL processing and an RML conversion unit 31 which performs RML conversion. The three bit code output by the modulation processing unit 23 is input to the RML processing unit 31. When RML conversion is not performed, the three bits are output as a code word without modification, and when RML is performed, they are output as a code word after substituting by "100-000-001".

Hence, by the construction shown in FIG. 1 and FIG. 3, modulation is performed by the F-RML(1–7) code of Table 4 which has a code limiting the minimum run repeat length to 5.

As a similar example, the converted code word "010-000-001" may be used as the code limiting the repeat length of the minimum run d, as shown in the following Table 5. A typical construction of the modulating unit using this table is identical to that of FIG. 1 or FIG. 3. Table 5 is also obtained by adding an RML code to the fixed length RLL(1–7) code of Table 3.

TABLE 5

RML-F (1,7;2,3;1<3>) (2)

| Immediately preceding code word | Current data word | Next data word | Converted code word |
| --- | --- | --- | --- |
| 0 | 00 | 11 | 010 |
| 0 | 00 | not11 | 100 |
| 0 | 01 | 0x | 010 |
| 0 | 01 | 1x | 101 |
| 0 | 10 | 0x | 000 |
| 0 | 10 | 1x | 001 |
| 1 | 10 | 11 | 010 |
| 1 | 10 | not11 | 000 |
| 0 | 11 | 0x | 000 |
| 1 | 11 | 0x | 010 |
| x | 11 | 1x | 001 |
| x | 01 | 11-01-1x | 010-000-001 |

"x" in the above conversion table shows that either 0 or 1 is acceptable. not11 means any of the data words 00, 01 and 10.

As is shown in Table 5, when the converted code word is "010-000-001", the converted code word maintains a minimum run d=1 and maximum run k=7. The converted code word in Table 4, of course, also maintains d=1 and maximum run k=7.

Here, a case will be considered where the maximum run k need not necessarily be maintained. That is, although the minimum run is closely related to recording and reproduction, and must therefore be maintained, the same is not true of the maximum run, so some formats may even comprise a T which is larger than the maximum run.

Applying this to the above RML conversion, the converted code word when RML conversion is performed may be a pattern which does not exist for example in the code word sequences after conversion by Table 3 provided that the minimum run d=1 is maintained. Hence, the following six patterns may be selected.

000-000-000 (1)

000-000-001 (2)

010-000-000 (3)

010-000-001 (4)

100-000-000 (5)

100-000-001 (6)

Two of these patterns, (4) and (6), maintain both the minimum run and maximum run. Of the others, i.e. (1), (2), (3), (5), the maximum run is not maintained, but they may be chosen as converted code words and can be demodulated as before.

In addition, as shown in Table 6 and Table 7, repetition of the minimum run can be limited even in a table where a RML code is added to Table 2, which is a fixed length RLL(1–7) code. The minimum run can then be repeated up to 5 times at most. In both Table 6 and Table 7 also, the minimum run and maximum run are maintained.

TABLE 6

RML-F (1,7;2,3;1<3>)

| Immediately preceding code word | Current data word | Next data word | Converted code word |
| --- | --- | --- | --- |
| x | 00 | 0x | 001 |
| 0 | 00 | 1x | 000 |
| 1 | 00 | 1x | 010 |
| 0 | 01 | 0x | 001 |
| 0 | 01 | 1x | 000 |
| 1 | 01 | 00 | 010 |
| 1 | 01 | not 00 | 000 |
| 0 | 10 | 0x | 101 |
| 0 | 10 | 1x | 010 |
| 0 | 11 | 00 | 010 |
| 0 | 11 | not 00 | 100 |
| 0 | 10 | 00-10-0x | 100-000-001 |

TABLE 7

RML-F (1,7;2,3;1<3>) (2)

| Immediately preceding code word | Current data word | Next data word | Converted code word |
| --- | --- | --- | --- |
| x | 00 | 0x | 001 |
| 0 | 00 | 1x | 000 |
| 1 | 00 | 1x | 010 |
| 0 | 01 | 0x | 001 |
| 0 | 01 | 1x | 000 |
| 1 | 01 | 00 | 010 |
| 1 | 01 | not00 | 000 |
| 0 | 10 | 0x | 101 |
| 0 | 10 | 1x | 010 |
| 0 | 11 | 00 | 010 |
| 0 | 11 | not00 | 100 |
| 0 | 10 | 00-10-0x | 010-000-001 |

"x" in the above conversion table shows that either 0 or 1 is acceptable. not00 means any of the data words 01, 10 and 11.

It must be possible to distinguish the above RML converted code words shown in Table 4, Table 5, Table 6 and Table 7 from other code words when demodulation is performed. The process of demodulation will now be described.

Table 8 is a demodulation table of the F-RML(1–7) code table, Table 4.

TABLE 8

DEM-RML-F (1, 7; 2, 3; 1<3>)

| Immediately preceding code word | Current code word | Next code word | Demodulated data word |
| --- | --- | --- | --- |
| x10 | 000 | xxx | 11 |
| not x10 | 000 | xxx | 10 |
| x00 | 001 | xxx | 10 |
| not x00 | 001 | xxx | 11 |
| xx1 | 010 | 00x | 10 |
| xx1 | 010 | not 00x | 11 |
| xx0 | 010 | 00x | 00 |
| xx0 | 010 | not 00x | 01 |
| xxx | 100 | xxx | 00 |
| xxx | 101 | xxx | 01 |
| xxx | 100 | 000-001 | 01-11-01 |

"x" in the above table shows that either 0 or 1 is acceptable. notx00 means any of the code words x11, x10 and x01. not00x means any of the code words 11x, 10 x and 01x.

Figure 4:
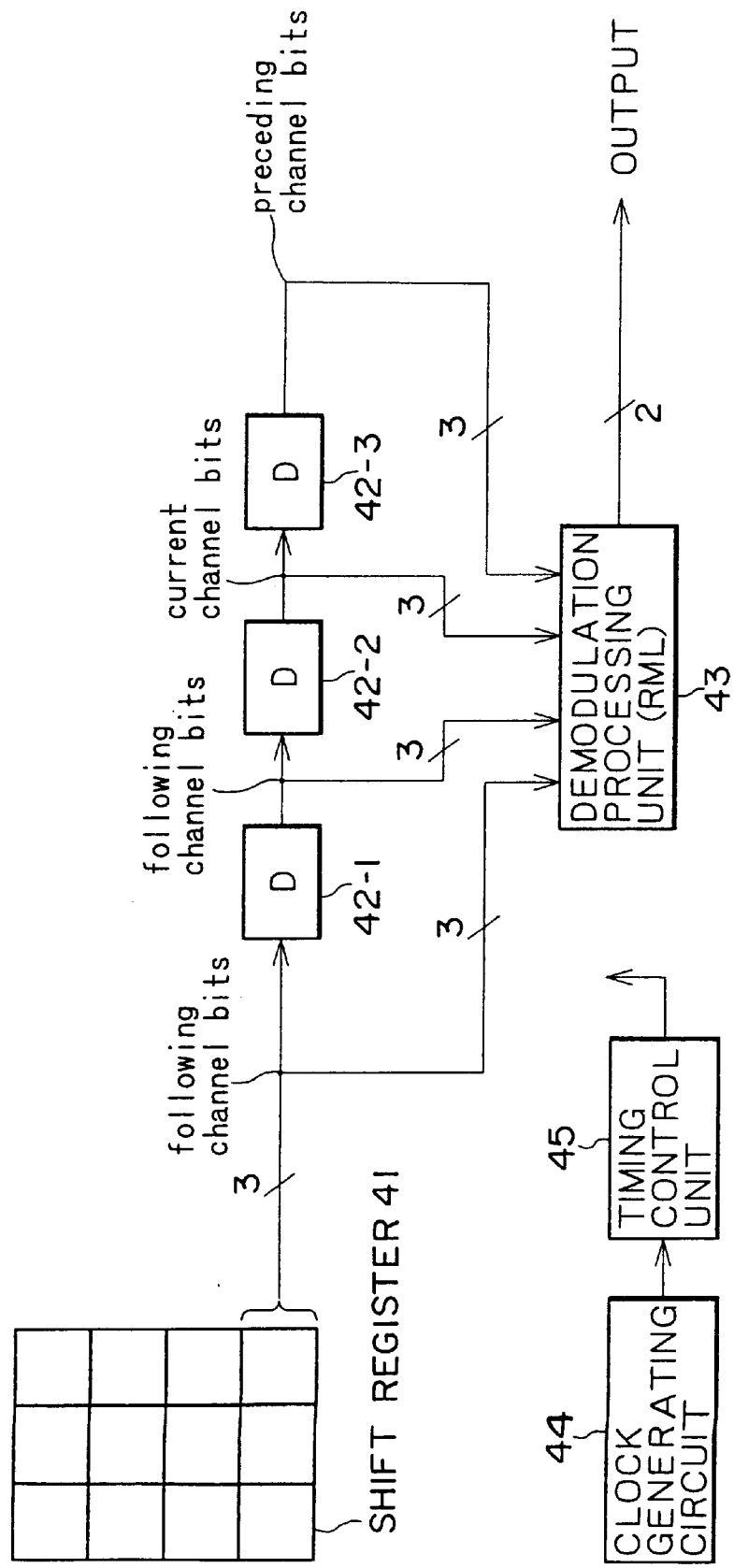
FIG. 4 is a block diagram showing a typical construction of one embodiment of a demodulating device according to this invention.

FIG. 4 shows a specific example of the construction of a demodulating device which performs demodulation using Table 8 as the demodulation table.

In this construction, a shift register 41 reads data three bits at a time, and it supplies it to a demodulation processing unit 43 via delay elements 42-1 to 42-3. Codes are also supplied to the demodulation processing unit 43 from the input stages of the delay elements 42-1 to 42-3. Therefore, four consecutive blocks (12 bits) of code are supplied to the demodulation processing unit 43. The demodulation processing unit 43 demodulates the codes input in block units, and outputs data in two bit units.

A clock generation circuit 44 generates a clock which is output to a timing control unit 45. The timing control unit 45 generates a signal in synchronism with the input clock, and outputs it to each unit.

In FIG. 4, the shift register 41 outputs data to the demodulation processing unit while shifting the data three bits at a time via the delay elements 42-1 to 42-3. Therefore, in addition to the current block of data, the immediately preceding block of data and the data for the following two blocks are input to the demodulation processing unit 43.

The demodulation processing unit 43 converts code words to data words according to the conversion rules shown in Table 8. That is, it converts it to data words referring to the current code word, the next code word and the immediately preceding code word input via the delay element 42-3. For the immediately preceding code word, it is sufficient if at least the last two bits are present.

In the RML demodulating unit of the demodulation processing unit 43, if the current code word is "100", the last six code bits (channel bits) are looked up, and if "100" is followed by "000-001", the code word "01-11-01" is output. In this case, as three blocks of data are determined at once, timing control is performed so that data is output two bits at a time in the output unit of the demodulation processing unit 43.

When demodulation other than RML conversion is performed, processing is performed one block, i.e. three code word units, at a time, and two data words are output. For example, when the last two bits of the immediately preceding code word are "10" and the current code word is "000", it is determined that the current code word should be demodulated to the data word "11" regardless of the following code word, and "11" is output. Also, for the purpose of subsequent processing, the last two bits "00" of the code word are re-input to the demodulation processing unit 43 via the delay element 42-3.

As immediately preceding code words input to the demodulation processing unit 43, the last two bit code words of three code words or nine code words of the current code words may be used. For example, in the case of RML conversion, if the output is "01-11-01" and the converted code word is "100-000-001". the immediately preceding two bits "01" used by the demodulation processing unit 43 which are required for subsequent demodulation processing are supplied by the delay element 42-3.

Figure 5:
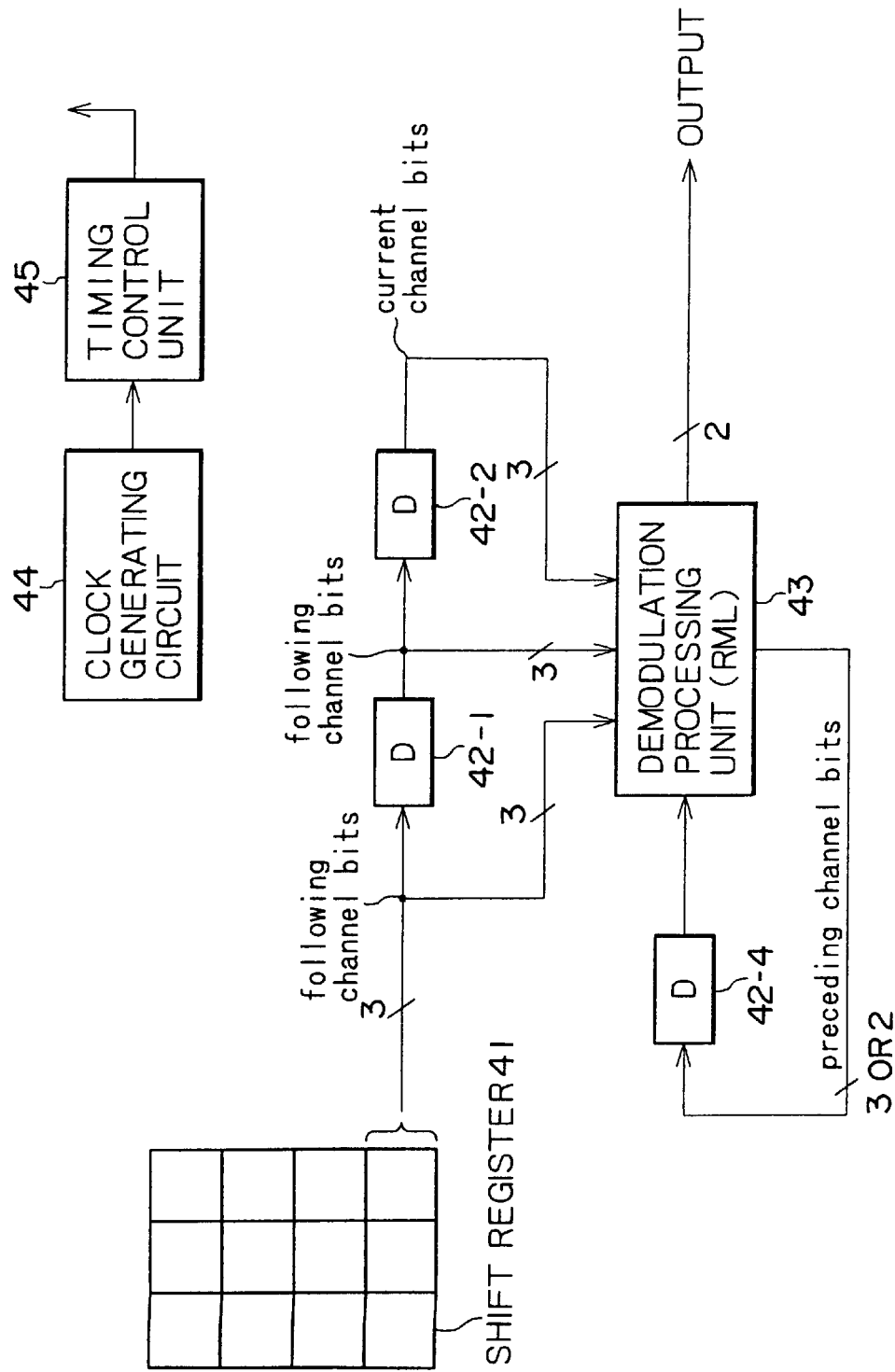
FIG. 5 is a block diagram showing a modification of the embodiment of FIG. 4.

FIG. 5 shows a modification of the demodulating device of FIG. 4. In the demodulating unit of FIG. 5, a delay element 42-4 is provided to return preceding channel bit information to the demodulation processing unit 43, and the delay element 42-3 of FIG. 4 is omitted In this case, after demodulation is determined in the demodulation processing unit 43, the last three bits (or at least two bits) of the determined code word are output separately from the actual code word, and re-input as immediately preceding code word information via the delay element 42-4 at the next clock timing.

Figure 6:
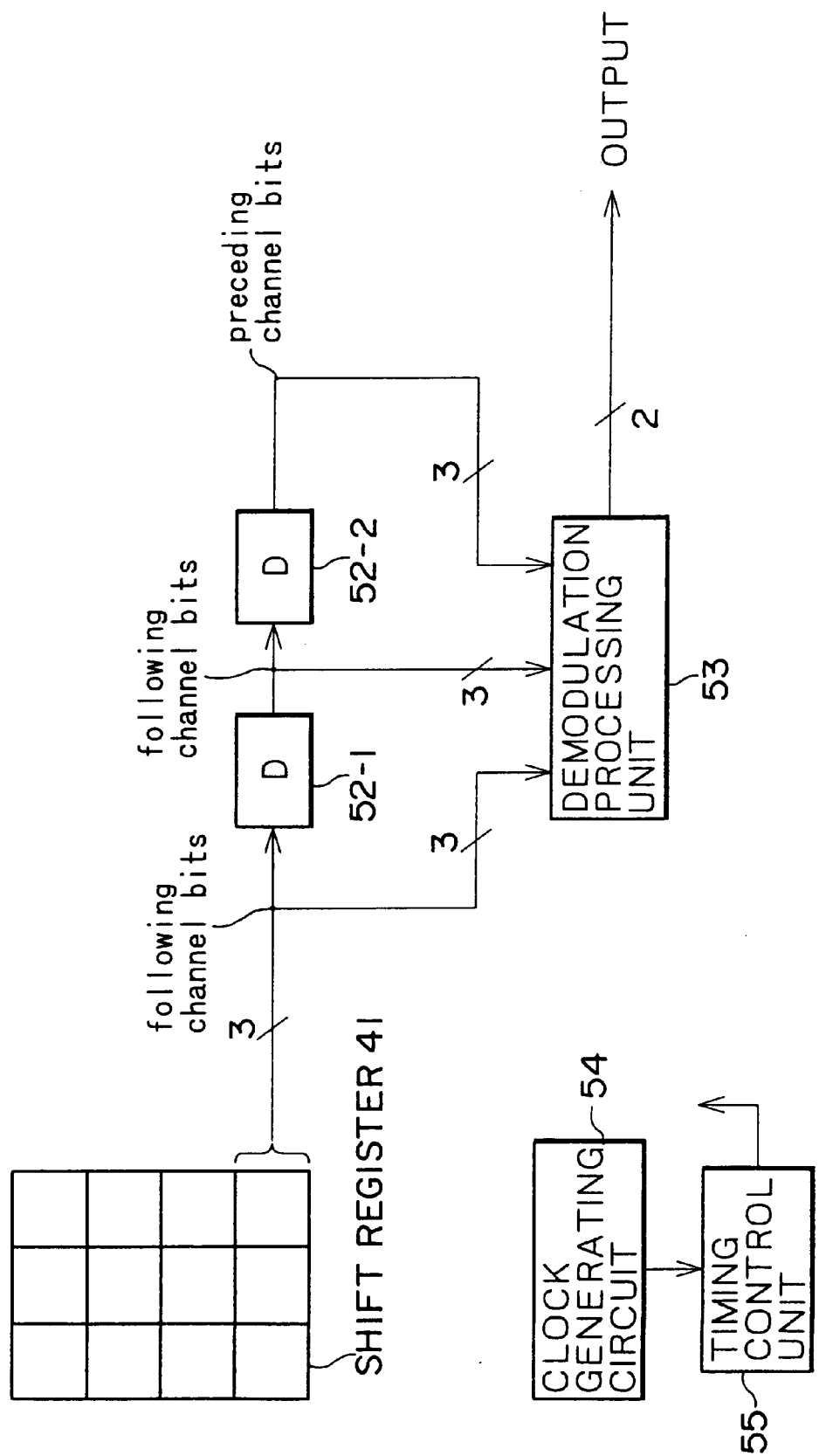
FIG. 6 is a block diagram showing a typical construction of a prior art demodulating device for comparison with the embodiment of FIG. 4.

For comparison, FIG. 6 shows a typical construction of a demodulating device which performs demodulation processing using the table of Table 3, which is a conventional fixed length RLL(1–7) code. In the case of FIG. 6, the preceding code word, current code word and next code word may be looked up to two bits, so two stages of delay elements 52-1, 52-2 may be provided. A demodulation processing unit 53 converts data words to code words according to conversion rules in Table 9 shown below. The data words so determined are always output every four bits. Compared to the construction of FIG. 4, the number of delay elements is reduced from three to two.

Figure 7:
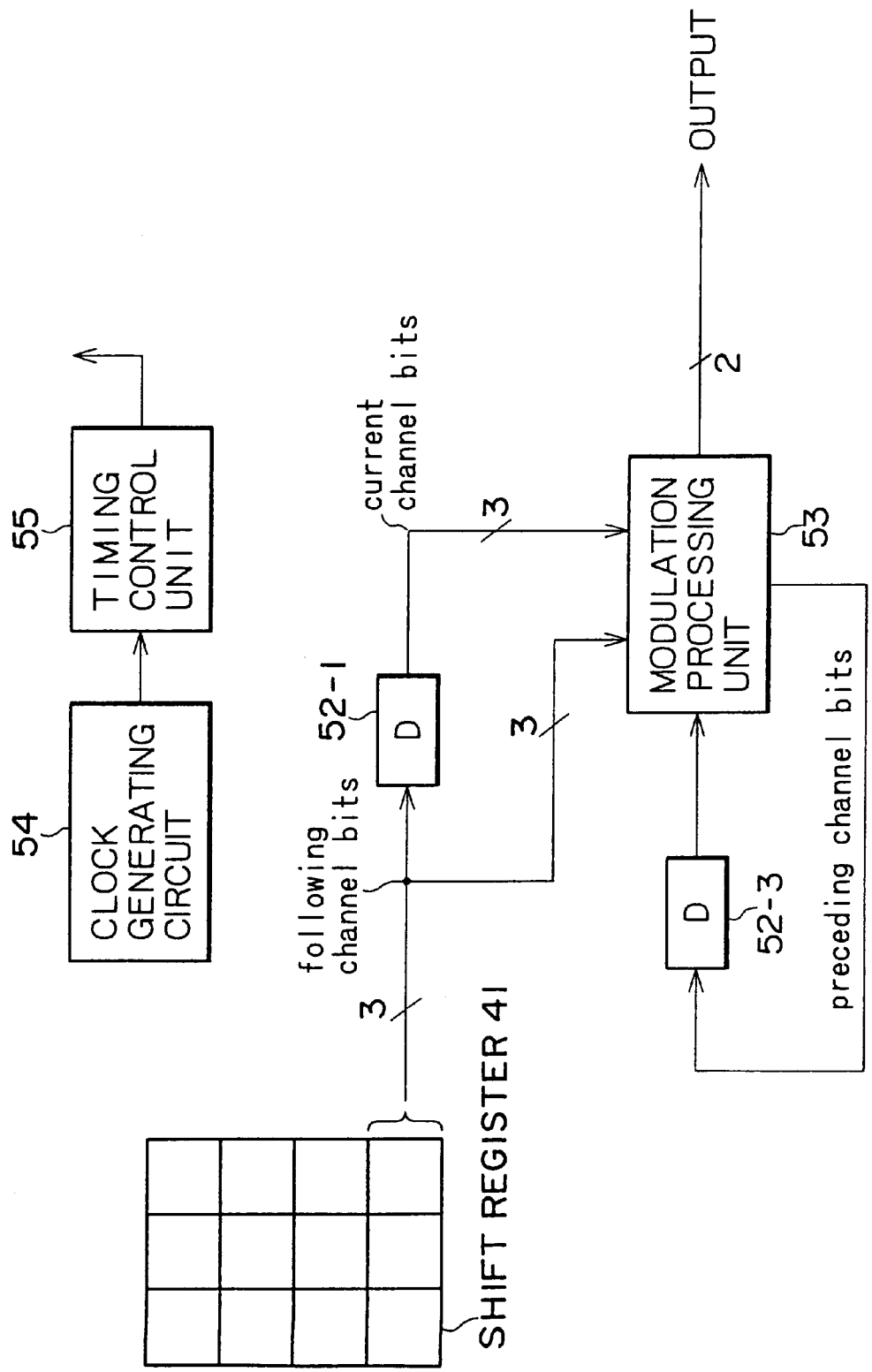
FIG. 7 is a block diagram showing a typical construction of a prior art demodulating device for comparison with the embodiment of FIG. 5.

In the same way as the construction of FIG. 4 was modified to give FIG. 5, a modification of the construction of FIG. 6 gives FIG. 7. In this case also, after demodulation is determined in the demodulation processing unit 53, the final three bits (or at least two bits) of the determined code word are output separately, and re-input to the demodulation processing unit 53 as immediately preceding code word information via the delay element 52-3 at the next clock timing. In this case also, compared to FIG. 5, the number of delay elements is less by one.

The construction when the demodulation processing of Table 2, which is a fixed length RLL code, is performed, is as shown in FIG. 6 or FIG. 7.

TABLE 9

DEM-RLL-F (1, 7; 2, 3; 1)

| Immediately preceding code word | Current code word | Next code word | Demodulated data word |
| --- | --- | --- | --- |
| x10 | 000 | xxx | 11 |
| not x10 | 000 | xxx | 10 |
| x00 | 001 | xxx | 10 |
| not x00 | 001 | xxx | 11 |
| xx1 | 010 | 00x | 10 |
| xx1 | 010 | not 00x | 11 |
| xx0 | 010 | 00x | 00 |
| xx0 | 010 | not 00x | 01 |
| xxx | 100 | xxx | 00 |
| xxx | 101 | xxx | 01 |

"x" in the above table shows that either 0 or 1 is acceptable. notx00 means any of the code words x11, x10 and x01. notx10 means any of the code words x11, x01 and x00. not00x means any of the code words 11x, 10x and 01x.

Figure 8:
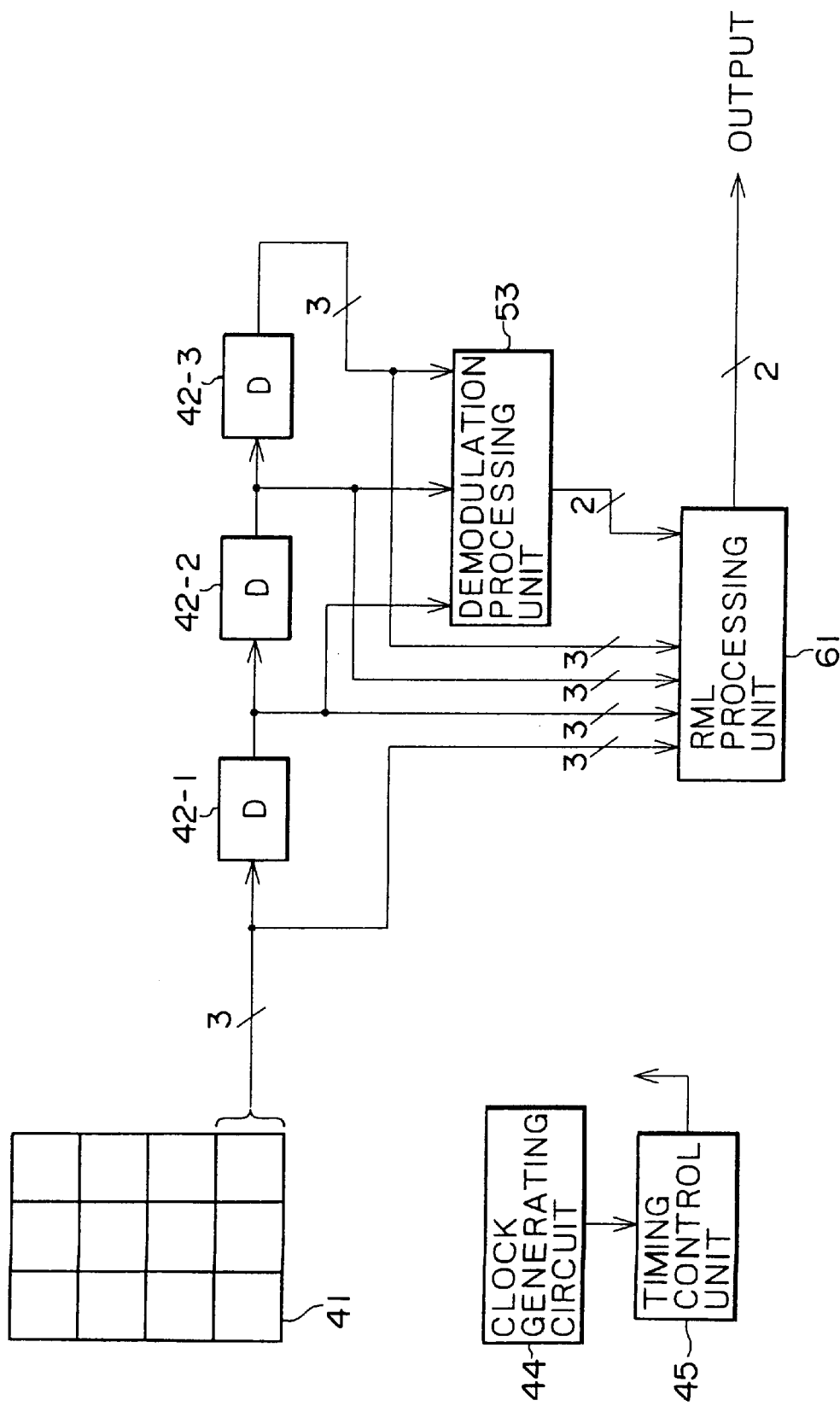
FIG. 8 is a block diagram showing the construction of another embodiment of the demodulating device according to this invention.

FIG. 8 shows another example of the construction of the demodulating device of FIG. 4 using the Table of FIG. 8 which is a fixed length RML(1–7) code. The demodulation processing unit 43 in FIG. 4 is divided into the same modulation processing unit 53 as that of FIG. 6 which shows conventional RLL processing, and an RML processing unit 61 which performs RML processing.

Hence, demodulation of the F-RML(1–7) code of Table 4 or Table 5 comprising a code which limits minimum runs from repeating more than 5 times, can be performed by the construction of FIG. 4 and FIG. 8.

As a similar example, the code which limits repetition of minimum runs maybe the converted code word "010-000-001", as shown in the following Table 10. The construction of the demodulating device is then identical to that of FIG. 4 or FIG. 8.

TABLE 10

DEM-RML-F (1, 7; 2, 3; 1<3>) (2)

| Immediately preceding code word | Current code word | Next code word | Demodulated data word |
|---|---|---|---|
| x10 | 000 | xxx | 11 |
| not x10 | 000 | xxx | 10 |
| x00 | 001 | xxx | 10 |
| not x00 | 001 | xxx | 11 |
| xx1 | 010 | 00x | 10 |
| xx1 | 010 | not 00x | 11 |
| xx0 | 010 | 00x | 00 |
| xx0 | 010 | not 00x | 01 |
| xxx | 100 | xxx | 00 |
| xxx | 101 | xxx | 01 |
| xxx | 010 | 000-001 | 01-11-01 |

"x" in the above table shows that either 0 or 1 is acceptable. notx00 means any of the code words x11, x10 and x01. notx10 means any of the code words x11, x01 and x00. not00x means any of the code words 11x, 10x and 01x.

Table 11 and Table 12 show demodulating tables based on Table 2.

TABLE 11

DEM-RML-F (1, 7; 2, 3; 1<3>)

| Immediately preceding code word | Current code word | Next code word | Demodulated data word |
|---|---|---|---|
| x10 | 000 | xxx | 00 |
| not x10 | 000 | xxx | 01 |
| x00 | 001 | xx | 01 |
| not x00 | 001 | xxx | 00 |
| xx0 | 010 | 00x | 11 |
| xx0 | 010 | not 00x | 10 |
| xx1 | 010 | 00x | 01 |
| xx1 | 010 | not 00x | 00 |
| xxx | 100 | xxx | 11 |
| xxx | 101 | xxx | 10 |
| xxx | 100 | 000-001 | 10-00-10 |

"x" in the above table shows that either 0 or 1 is acceptable. notx00 means any of the code words x11, x10 and x01. notx10 means any of the code words x11, x01 and x00 not00x means any of the code words 11x, 10x and 01x.

TABLE 12

DEM-RML-F (1, 7; 2, 3; 1<3>) (2)

| Immediately preceding code word | Current code word | Next code word | Demodulated data word |
|---|---|---|---|
| x10 | 000 | xxx | 00 |
| not x10 | 000 | xxx | 01 |
| x00 | 001 | xxx | 01 |
| not x00 | 001 | xxx | 00 |
| xx0 | 010 | 00x | 11 |
| xx0 | 010 | not 00x | 10 |
| xx1 | 010 | 00x | 01 |
| xx1 | 010 | not 00x | 00 |
| xxx | 100 | xxx | 11 |
| xxx | 101 | xxx | 10 |
| xxx | 010 | 000-001 | 10-00-10 |

"x" in the above table shows that either 0 or 1 is acceptable. notx00 means any of the code words x11, x10 and x01. notx10 means any of the code words x11, x01 and x00. not00x means any of the code words 11x, 10x and 01x.

Next, the result of modulation by codes limiting repetition of Tmin will be described A simulation of the distribution of each T and continuous Tmin when an arbitrarily generated random data of 13107200 bits is modulated by a modulating code table, is given below.

First, the results of modulating the F-RLL (1,7;2,3;2) of Table 3 are shown, i.e. the results obtained when there is no limitation on the repetition of Tmin. It was found that when the size of the modulating data was 19660794 channel bits, Tmin was 2T and Tmax was 8T.

The distribution of T was:

| | |
|---|---|
| 1T | 0 |
| 2T | 2376716 |
| 3T | 1494695 |
| 4T | 943039 |
| 5T | 591924 |
| 6T | 375004 |
| 7T | 153675 |
| 8T | 45719 |
| 9T | 0. |

The repetitions of 2T were:

| | |
|---|---|
| 1 time | 864210 |
| 2 times | 343684 |
| 3 times | 135827 |
| 4 times | 53777 |
| 5 times | 21641 |
| 6 times | 8538 |
| 7 times | 3349 |
| 8 times | 1384 |
| 9 times | 531 |
| 10 times | 220 |
| 11 times | 90 |
| 12 times | 29 |
| 13 times | 14 |
| 14 times | 5 |
| 15 times | 2 |
| 16 times | 0 |
| 17 times | 0 |
| 18 times | 0. |

2T was repeated a maximum of 15 times.

Next, the result of modulation using F-RML(1,7;2,3;1) was as follows. It was found that when the size of the modulating data was 19660794 channel bits, Tmin was 2T and Tmax was 8T. It was also found that 1:1 demodulation was performed according to Table 4.

The distribution of T was:

| | |
|---|---|
| 1T | 0 |
| 2T | 2183376 |
| 3T | 1494695 |
| 4T | 943039 |
| 5T | 591924 |
| 6T | 375004 |
| 7T | 153675 |
| 8T | 94054 |
| 9T | 0. |

Compared to the results according to Table 3, there were fewer occurrences of 2T and more occurrences of 8T. This is due to the substitute code pattern.

The repetitions of 2T were:

| | |
|---|---|
| 1 time | 887722 |
| 2 times | 352940 |
| 3 times | 137723 |
| 4 times | 35302 |
| 5 times | 7079 |
| 6 times | 0 |
| 7 times | 0 |
| 8 times | 0 |
| 9 times | 0 |

2T was repeated a maximum of 5 times. From this, it was found that the code limiting repetition of Tmin according to Table 4 is effective.

The result of modulation by Table 5, which is another F-RML(1–7) code, is shown below. It was found that when the size of the modulating data was 19660794 channel bits, Tmin was 2T and Tmax was 8T. It was also found that 1:1 demodulation was performed according to Table 5.

The distribution of T was:

| | |
|---|---|
| 1T | 0 |
| 2T | 2165726 |
| 3T | 1499624 |
| 4T | 948015 |
| 5T | 594585 |
| 6T | 376880 |
| 7T | 203291 |
| 8T | 47646 |
| 9T | 0. |

In Table 4, as the RML conversion code comprises 8T, 8T increased, but in Table 5, as the RML conversion code comprises 7T, 7T increased.

The repetitions of 2T were:

| | |
|---|---|
| 1 time | 879438 |
| 2 times | 348257 |
| 3 times | 137723 |
| 4 times | 35302 |
| 5 times | 7079 |
| 6 times | 0 |
| 7 times | 0 |
| 8 times | 0 |
| 9 times | 0 |

2T was repeated a maximum of 5 times, and there is not much difference between Table 4 and Table 5. From this, it was found that the code limiting repetition of Tmin according to Table 5 is effective.

From the distribution numbers of T, it was found that the occurrence frequency of 2T was reduced, which means that errors due to 2T are also reduced.

Next, as part of the demodulation results according Table 4 which is a code limiting repetition of Tmin, simulation results will be given for error propagation after demodulation when an edge bit shift has occurred.

The data was obtained by modulating arbitrarily generated random data by the RML (1,7) modulation code Table 4 and Table 5, and demodulating the result when the edge "1" was shifted backwards or forwards about every other 101 channel bits in the code sequence. For errors which did not exist in the tables and which could be removed, "0" was inserted in each data sequence. The extent of error propagation was evaluated by comparing the demodulated data sequence comprising errors and the data sequence demodulated by the correct code sequence.

The demodulation results using Table 8, after modulating based on F-RML (1,7;2,3;1) and generating a bit shift error, are as follows. Error propagation when a forward bit shift error is introduced is up to 8 bits The size of the data sequence is 10,922,664.

[Forward bit shift]
0bit:0 1bit:76619 2 bit:41788 3bit:21802 4bit:13428 5 bit:4732 6bit:1692 7bit:2078 8bit:78 9bit:0 10bit:0 11bit:0 12bit:0
average_length: 2.02 (328295/162217)

[Backward bit shift]
0bit:4283 1bit:81892 2bit:41319 3bit:18041 4bit:7476 5bit:4207 6bit:3494 7bit:1505 8bit:0 9bit:0 10bit:0 11bit:0 12bit:0
average_length: 1.86 (301091/162217)

In other words, the worst error propagation when there is a bit shift error was 8 data bits (2 symbol data bits).

The demodulation results using Table 10, after modulating based on F-RML (1,7;2,3;1) in Table 5 which is another F-RML(1–7) code, and generating a bit shift error, are as follows.

[Forward bit shift]
0bit:0 1bit:76619 2bit:41788 3bit:21054 4bit:12538 5bit:5695 6bit:2717 7bit:1632 8bit:0 9bit:174 10bit:0 11bit:0 12bit:0
average_length: 2.04 (331276/162217)

[Backward bit shift]
0bit:4283 1bit:83235 2bit:41627 3bit:15689 4bit:7237 5bit:2680 6bit:4481 7bit:2372 8bit:345 9bit:162 10bit:106 11bit:0 12bit:0
average_length: 1.88 (304672/162217)

In other words, the difference is in the error propagation when there is a bit shift error. The worst error propagation due to Table 5 was 10 data bits (3 symbol data bits).

When modulation was performed based on Table 3, which is a conventional F-RLL(1,7) technique wherein repetition of minimum runs is not restricted, and demodulation was performed using Table 9, the worst error propagation when there was a bit shift was 5 bits (2 symbol data bits). This shows that error propagation due to bit shift error is different by an amount equivalent to the increased size of Table 11 and Table 12, and Table 8 and Table 10. However in terms of symbols which are 8 bit units, for Table 3 and Table 4, the worst error propagation when there was a bit shift was 2 symbol data bits in both cases.

Hence the invention limits the repeat frequency of the minimum run, and therefore offers the following advantages.

(1) Compared to the prior art, there are fewer parts with a low signal level, so the precision of waveform processing such as AGC or PLL is improved and overall characteristics are enhanced.

(2) Compared to the prior art, the path memory length during Viterbi decoding, etc., can be made shorter, and the circuit scale can be reduced.

Further, according to this invention, from the distribution of T in the modulation results, the minimum run 2T with a large number of error occurrence points is reduced, so the error rate is improved.

In addition to recording media such as magnetic disks, CD-ROM and solid memories, as media for transmitting the program which performs the aforesaid processing to the user, communication media such as networks and satellites may also be used.

As described hereabove, in the modulating device of claim 1, modulating method of claim 15 and transmitting medium of claim 16, a code was assigned for limiting the repeat frequency when the minimum run d occurs a predetermined number of times, so overall data detecting performance is enhanced.

Further, in the demodulating device of claim 17, demodulating method of claim 21 and transmitting medium of claim 22, the code limiting the minimum run d from repeating a predetermined number of times was converted to a predetermined data sequence, therefore design is easier from the viewpoint of clock reproduction and the construction of the demodulating device is simplified.

What is claimed:

1. A modulating device which converts data having a basic data length of m bits into fixed length codes (d,k;m,n;1) having a basic code length of n bits, comprising:
    dividing means for dividing a data sequence into m bit code words; and
    conversion means which converts an m bit data sequence having a minimum run d of 1 or more into an n bit fixed length code, and when the minimum run d in a channel bit sequence after fixed length code conversion is repeated a predetermined number of times, converts said data sequence into a restriction code which limits this repeated number of times.

2. A modulating device as claimed in claim 1, wherein said conversion means comprises first conversion means which converts m bits of data having a minimum run d of 1 or more into an n bit fixed length code, and second conversion means which, when the minimum run length d in a channel bit sequence after conversion to a fixed length code is repeated a predetermined number of times, converts said data sequence into a restriction code which limits this repeated number of times.

3. A modulating device as claimed in claim 1, wherein said restriction code is assigned by increasing a restriction length which is a fixed length.

4. A modulating device as claimed in claim 1, wherein said restriction code is generated by a code other than said restriction code, or plural combinations of parts thereof.

5. A modulating device as claimed in claim 1, wherein said restriction code is a code which can be distinguished from other codes during demodulation, and is chosen to maintain the minimum run d.

6. A modulating device as claimed in claim 5, wherein said maximum run for said restriction code is at least k.

7. A modulating device as claimed in claim 5, wherein said code words maintain the rule of minimum run d and maximum run k of fixed length codes even when said restriction code is not used.

8. A modulating device as claimed in claim 5, wherein said minimum run d is 1.

9. A modulating device as claimed in claim 8, wherein said maximum run k is seven, and the highest frequency of repeated minimum runs d is 5.

10. A modulating device as claimed in claim 8, wherein said maximum run k is 7, and the maximum restriction length of said restriction code is at least 3.

11. A modulating device as claimed in claim 8, wherein said maximum run k is seven, and a number of bits required to determine said restriction code is at least 7.

12. A modulating device as claimed in claim 8, wherein said maximum run k is 7, and said restriction code is at least 9 bits.

13. A modulating device as claimed in claim 8, wherein said maximum run k is 7, and a code sequence comprising said restriction code maintains the rule of minimum run d and maximum run k.

14. A modulating device as claimed in claim 8, wherein the maximum run k is 7, and a code sequence comprising said restriction code maintains the minimum run d but does not maintain the maximum run k.

15. A modulating method for converting data having a basic data length of m bits into a fixed length code (d,k;m,n;1) having a basic code length of n bits wherein, when the minimum run d in a channel bit sequence after conversion to a fixed length code having a minimum run d of 1 or more is repeated a predetermined number of times, a restriction code is assigned which limits this repeated number of times.

16. A transmitting medium for transmitting a program for converting data having a basic data length of m bits into a fixed length code (d,k;m,n;1) having a basic code length of n bits wherein, when the minimum run d in a channel bit sequence after conversion to a fixed length code having a minimum run d of 1 or more is repeated a predetermined number of times, said program assigns a restriction code which limits this repeated number of times.

17. A demodulating device which converts a fixed length code (d,k;m,n;1) having a basic code length of n bits into data having a basic data length of m bits, comprising dividing means for dividing a code word sequence into n bit data sequences, and comprising conversion means which converts an n bit fixed length code having a minimum run d of 1 or more into an m bit data sequence, and when the minimum run d in a channel bit sequence of the fixed length code is repeated a predetermined number of times, converts a restriction code which limits this repeated number of times into a predetermined data sequence.

18. A demodulating device as claimed in claim 17, wherein said conversion means comprises first conversion means which converts the n bit fixed length code having a minimum run d or 1 or more into m bits of data, and second conversion means which converts the restriction code that limits the minimum run d in a channel bit sequence of the fixed length code from occurring a predetermined number of times, into predetermined data.

19. A demodulating device as claimed in claim 17, wherein said minimum run d is 1, a maximum run k is 7, and the number of code word bits required to determine said restriction code is at least 9.

20. A modulating device as claimed in claim 17, wherein said minimum run d is 1, a maximum run k is 7, and the number of bits converted from said restriction code is at least 6.

21. A demodulating method for converting a fixed length code (d,k;m,n;1) having a basic code length of n bits into data having a basic data length of m bits wherein, when an n bit fixed length code having a minimum run d of 1 or more is converted into an m bit data sequence, a restriction code which limits the number of times the minimum run d occurs in a channel bit sequence of the fixed length code, is converted to a predetermined data sequence.

22. A transmitting medium for transmitting a program using (a demodulating device for converting a fixed length code (d,k;m,n;1) having a basic code length of n bits into data having a basic data length of m bits wherein, when an n bit fixed length code having a minimum run d of 1 or more is converted into an m bit data sequence, said program converts a restriction code which limits the number of times the minimum run d occurs in a channel bit sequence of the fixed length code, into a predetermined data sequence.

* * * * *